(12) United States Patent
Tsai et al.

(10) Patent No.: US 10,054,810 B2
(45) Date of Patent: Aug. 21, 2018

(54) DISPLAY APPARATUS AND PIXEL STRUCTURE THEREOF

(71) Applicant: E Ink Holdings Inc., Hsinchu (TW)

(72) Inventors: Xue-Hung Tsai, Hsinchu (TW); Wei-Tsung Chen, Hsinchu (TW); Henry Wang, Hsinchu (TW); Po-Hsin Lin, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 0 days.

(21) Appl. No.: 15/642,351

(22) Filed: Jul. 6, 2017

(65) Prior Publication Data
US 2018/0088397 A1    Mar. 29, 2018

(30) Foreign Application Priority Data
Sep. 29, 2016   (CN) .......................... 2016 1 0861378

(51) Int. Cl.
| H01L 29/49 | (2006.01) |
| G02F 1/1333 | (2006.01) |
| H01L 27/12 | (2006.01) |
| G02F 1/167 | (2006.01) |
| G09G 3/34 | (2006.01) |

(52) U.S. Cl.
CPC ........ *G02F 1/133345* (2013.01); *G02F 1/167* (2013.01); *G09G 3/3446* (2013.01); *H01L 27/1248* (2013.01); *H01L 27/1288* (2013.01); *G02F 2201/123* (2013.01)

(58) Field of Classification Search
CPC . G02F 1/133345; G02F 1/167; H01L 27/1248
See application file for complete search history.

(56) References Cited

U.S. PATENT DOCUMENTS

| 6,777,254 B1 * | 8/2004 | Yamazaki ............... H01L 27/12 257/E27.111 |
| 9,164,275 B2 | 10/2015 | Kimura |
| 9,177,970 B2 | 11/2015 | Amari |
| 2007/0153170 A1 | 7/2007 | Yao |

(Continued)

FOREIGN PATENT DOCUMENTS

| CN | 105514141 A | 4/2016 |
| TW | 201222122 A1 | 6/2012 |
| TW | 201616640 A | 5/2016 |

OTHER PUBLICATIONS

Corresponding Taiwanese Office Action dated Nov. 22, 2016.

*Primary Examiner* — Michael Shingleton
(74) *Attorney, Agent, or Firm* — CKC & Partners Co., Ltd.

(57) ABSTRACT

A display apparatus includes at least one pixel structure, which includes an active device, an electric insulation layer and a pixel electrode. The electric insulation layer is disposed on the active device. The electric insulation layer has a trench and a via. The via is located on a bottom surface of the trench. A portion of the electric insulation layer surrounding the trench is monolithically connected to another portion of the electric insulation layer surrounding the via. A pixel electrode has a first electrode portion and a second electrode portion connected to each other. The first electrode portion is located in the trench. A thickness of the first electrode portion is less than a depth of the trench. The second electrode portion is located in the via and is electrically connected to the active device through the via.

12 Claims, 7 Drawing Sheets

(56) References Cited

U.S. PATENT DOCUMENTS

| | | |
|---|---|---|
| 2010/0014031 A1 | 1/2010 | Kikuchi |
| 2010/0134740 A1* | 6/2010 | Nakao ............... G02F 1/136204<br>349/138 |
| 2014/0246711 A1 | 9/2014 | Amari |
| 2016/0300860 A1* | 10/2016 | Park .................... H01L 27/1225 |

* cited by examiner

DISPLAY APPARATUS AND PIXEL STRUCTURE THEREOF

RELATED APPLICATIONS

This application claims priority to Chinese Application Serial Number 201610861378.X, filed Sep. 29, 2016, which is herein incorporated by reference.

BACKGROUND

Technical Field

The present disclosure relates to a display apparatus, especially to a display apparatus and a pixel structure thereof.

Description of Related Art

In general, a flat panel display includes a driving substrate, a display medium layer and an opposite substrate. The display medium layer, located between the driving substrate and the opposite substrate, can be driven by the driving substrate to display images and can be protected by the opposite substrate. Since the flat panel display may undergo various mechanical impacts during transportation and operation thereof, improvement for endurance of the flat panel display may be desirable.

SUMMARY

Embodiments of the present disclosure may be advantageous to improve endurance of the display apparatus against external mechanical impacts.

According to some embodiments of the present disclosure, a pixel structure includes an active device, an electric insulation layer and a pixel electrode. The electric insulation layer is disposed on the active device. The electric insulation layer has a trench and a via. The via is located on a bottom surface of the trench. A portion of the electric insulation layer surrounding the trench is monolithically connected to another portion of the electric insulation layer surrounding the via. A pixel electrode has a first electrode portion and a second electrode portion connected to each other. The first electrode portion is located in the trench. A thickness of the first electrode portion is less than a depth of the trench. The second electrode portion is located in the via and is electrically connected to the active device through the via.

According to some embodiments of the present disclosure, a display apparatus includes a driving substrate, a display medium layer and a cover lens. The driving substrate includes at least one active device, an electric insulation layer and at least one pixel electrode. The electric insulation layer is disposed on the active device and has at least one trench and at least one via formed on a bottom surface of the trench. The pixel electrode has a first electrode portion and a second electrode portion connected to each other. The first electrode portion is located in the trench, a thickness of the first electrode portion is less than a depth of the trench, and the second electrode portion is located in the via and electrically connected to the active device through the via. The display medium layer is disposed on the driving substrate. The cover lens is disposed on the display medium layer. A portion of the display medium layer is located between the cover lens and the electric insulation layer of the driving substrate.

In the foregoing embodiments, the first electrode portion is recessed with respect to a top surface of the electric insulation layer because the thickness of the first electrode portion is less than the depth of the trench of the electric insulation layer. As such, the electric insulation layer may reduce external mechanical impacts on the first electrode portion, and may thus obviate damage to the first electrode portion. Stated differently, the thickness of the first electrode portion is less than that of the top insulation portion. Such a thickness difference may be advantageous to obviate damage to the first electrode portion. This is due to the fact that the top insulation portion can reduce external mechanical impacts on the first electrode portion when the display apparatus encounters impact forces. Accordingly, embodiments of the present disclosure may be advantageous to improve endurance of the display apparatus against external mechanical impacts.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
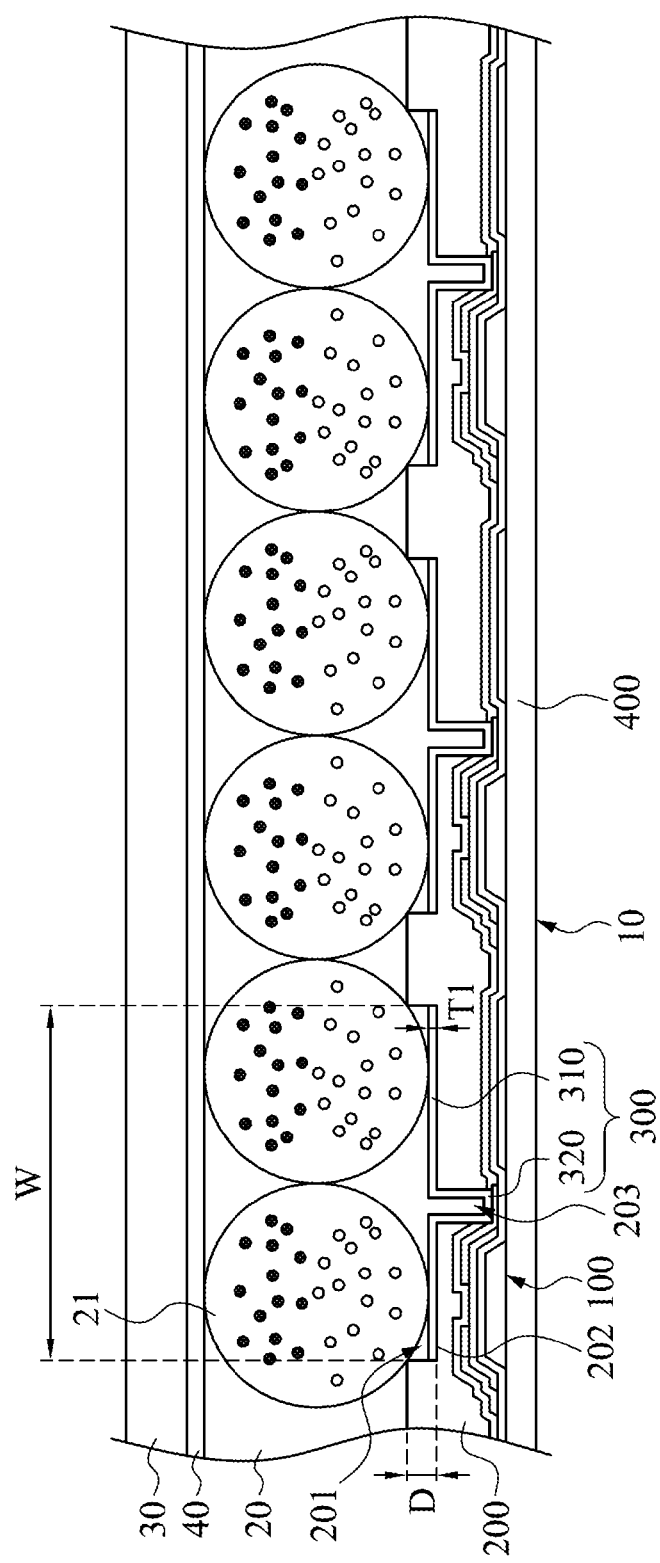
FIG. 1 is a cross-sectional view of a display apparatus in accordance with one embodiment of the present disclosure.

Reference will now be made in detail to the present embodiments of the disclosure, examples of which are illustrated in the accompanying drawings. Wherever possible, the same reference numbers are used in the drawings and the description to refer to the same or like parts.

FIG. 1 is a cross-sectional view of a display apparatus in accordance with one embodiment of the present disclosure. As shown in FIG. 1, in this embodiment, the display apparatus includes a driving substrate 10, a display medium layer 20 and a cover lens 30. The display medium layer 20 is disposed on the driving substrate 10, and it can be driven by an electric field generated from the driving substrate 10, so that the display medium layer 20 is capable of displaying images. The cover lens 30 is disposed on the display medium layer 20 and hence can protect the display medium layer 20. The driving substrate 10 includes a plurality of active devices 100, an electric insulation layer 200 and a plurality of pixel electrodes 300. The electric insulation layer 200 is disposed on the active devices 100 and hence covers the active devices 100. The pixel electrodes 300 are electrically connected to the active devices 100, respectively. Therefore, the pixel electrodes 300 can generate suitable electric fields to drive the display medium layer 20 and display images based on statuses of respective active devices 100. In some embodiments, each active device 100 is independently driven, and a single active device 100, a single pixel electrode 300 electrically connected thereto, and the electric insulation layer 200 can be collectively referred to as a pixel structure herein.

In some embodiments, the electric insulation layer 200 includes a trench 201 and a via 203. The trench 201 has a bottom surface 202 proximal to or geometrically closest to the active device 100. The via 203 is formed on the bottom surface 202 of the trench 201. The pixel electrode 300 has a first electrode portion 310 and a second electrode portion 320 connected to each other. The first electrode portion 310 is located on the trench 201 and covers the bottom surface 202 of the trench 201. In other words, the bottom surface 202 of the trench 201 can support the first electrode portion 310. The second electrode portion 320 is located in the via 203 and electrically connected to the active device 100 through the via 203. That is, a partial electrode of the active device 100 is exposed by the via 203, and the second electrode portion 320 can cover or contact with this exposed partial electrode, so that the second electrode portion 320 and the active device 100 can be electrically connected.

The first electrode portion 310 has a thickness T1. The trench 201 has a depth D. The thickness T1 of the first electrode portion 310 is less than the depth D of the trench 201. As such, the first electrode portion 310 is recessed with respect to the electric insulation layer 200. Therefore, the electric insulation layer 200 can reduce external mechanical impacts on the first electrode portion 310 when the display apparatus encounters external impact forces, so that damage to the first electrode portion 310 can be obviated. Take drop ball test as an example, a drop ball is usually sized in millimeter, and a pixel structure is usually sized in micrometer, the hence the drop ball is significantly larger than the pixel structure. Accordingly, impact forces from the drop ball can be shared by top of the electric insulation layer 200, instead of concentrated in the trench 201, thus reducing impact forces exerted on the first electrode portion 310.

In some embodiments, the depth D of the trench 201 can range from 0.5 um-5 um. Preferably, the depth D of the trench 201 satisfies: $1\ um \leq D \leq 5\ um$. The thickness T1 of the first electrode portion 310 is sized in nanometer, such as satisfying: $40\ nm \leq T1 \leq 50\ nm$. This size relation between the trench 201 and the first electrode portion 310 may reduce external mechanical impacts on the pixel electrode 300. In some embodiments, the trench 201 has a width W, which is sized in micrometer, such as satisfying: $1\ um \leq W \leq 200\ um$. The trench 201 having such a width W may be advantageous to spread impact forces over the top of the electric insulation layer 200, thus helping the display apparatus to pass through the drop ball test.

In some embodiments, the width W of the trench 201 is greater than a width of the via 203 (not labeled). Therefore, the first electrode portion 310 in the trench 201 can have a surface area greater than that of the second electrode portion 320 in the via 203. That is, a relatively small portion of the pixel electrode 300 is located in the via 203 to electrically connect to the active device 100, and a relatively large portion of the pixel electrode 300 is located on the bottom surface 202 of the trench 201 to provide an electric field high enough for the display medium layer 20.

In some embodiments, the depth D of the trench 201 is less than that of the via 203, and hence the via 203 can be deep enough such that the second electrode portion 320 can be electrically connected to the active device 100. Moreover, this depth relation between the trench 201 and via 203 may be advantageous such that the trench 201 is not unduly deep to affect the active device 100 underlying the trench 201, or to even expose source and drain of the active device 100 (not labeled).

In some embodiments, a portion of the display medium layer 20 is located in the trench 201 of the electric insulation layer 200. For example, the display medium layer 20 can be an electrophoretic layer that includes a plurality of microcapsules 21 therein. The microcapsules 21 can be partially located in the trench 201 and partially located on the top of the electric insulation layer 200. Using this configuration, when the display apparatus encounters external mechanical impacts, impact forces exerted on the microcapsules 21 will not be entirely applied to the first electrode portion 310 of the pixel electrode 300. Rather, the impact forces can be at least partially born by the electric insulation layer 200, so that damage to the pixel electrode 300 can be obviated.

Figure 2:
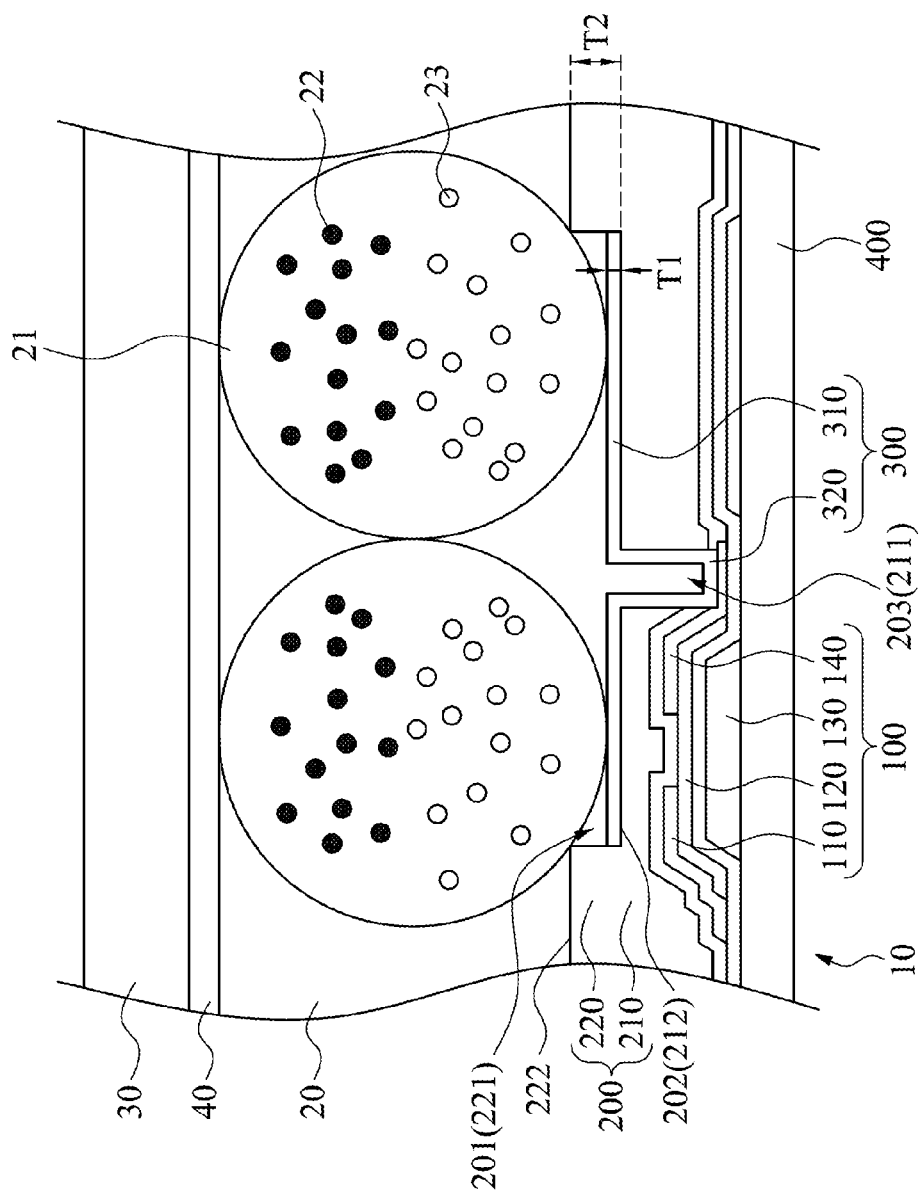
FIG. 2 is a fragmentary enlarged view of the display apparatus as shown in FIG. 1.

FIG. 2 is a fragmentary enlarged view of the display apparatus as shown in FIG. 1. As shown in FIG. 2, the electric insulation layer 200 has a trench 201, namely, the electric insulation layer 200 may include a bottom insulation portion 210 and a top insulation portion 220. The bottom insulation portion 210 is disposed on the active device 100. The bottom insulation portion 210 has a bottom through hole 211 and a top surface 212. The top insulation portion 220 is disposed on the bottom insulation portion 210. The top insulation portion 220 has a top through hole 221 therein. The top through hole 221 is located on and communicated with the bottom through hole 211. The top through hole 221 is wider than the bottom through hole 211. The first electrode portion 310 is located in the top through hole 221 and on the top surface 212 of the bottom insulation portion 210. In other words, the top surface 212 of the bottom insulation portion 210 can support or bear the first electrode portion 310. The second electrode portion 320 is located in the bottom through hole 211. The second electrode portion 320 is electrically connected to the active device 100 through the bottom through hole 211.

In some embodiments, the top insulation portion 220 has a thickness T2. The thickness T1 of the first electrode portion 310 is less than the thickness T2 of the top insulation portion 220. Therefore, a top surface 222 of the top insulation portion 220 can reduce external mechanical impacts on the first electrode portion 310 when the display apparatus encounters such impacts, and damage to the first electrode portion 310 can thus be reduced.

In some embodiments, the via 203 of the electric insulation layer 200 is surrounded by the bottom insulation portion 210, and the trench 201 of the electric insulation layer 200 is surrounded by the top insulation portion 220. In some embodiments, the bottom and top insulation portions 210 and 220 are monolithically connected. Stated differently, additional adhesives other than the bottom and top insulation portions 210 and 220 are absent between them. Such top and bottom insulation portions 210 and 220 can improve structural strength of the electric insulation layer 200 formed by them due to their monolithic connection.

In some embodiments, the bottom and top insulation portions 210 and 220 may include the same material. For example, the material of the bottom and top insulation portions 210 and 220 may include positive photoresist, which includes, but is not limited to, resin and sensitizer. Therefore, the trench 201 and via 203 can be formed using exposure and develop, which will be detailed later.

In some embodiments, the cover lens 30 and the top insulation portion 220 surrounding the trench 201 are spaced apart by the display medium layer 20. In other words, a portion of the display medium layer 20 is located between the top insulation portion 220 and the cover lens 30.

In some embodiments, the first and second electrode portions 310 and 320 are monolithically connected to improve structural strength of the pixel electrode 300 formed by them. In some embodiments, the first and second electrode portions 310 and 320 may include the same material. For example, the material of the first and second electrode portions 310 and 320 may include, but is not limited to, aluminum, platinum, silver, titanium, molybdenum, zinc, tin, chromium, or other suitable metals or alloys. In some other embodiments, the material of the pixel electrode 300 may also include a transparent conductive material.

In some embodiments, the display apparatus further includes a common electrode layer 40. The common electrode layer 40 is located between the cover lens 30 and the display medium layer 20, so that the common electrode layer 40 can be protected by the cover lens 30 and can provide suitable electric fields for the display medium layer 20 in cooperation with the driving substrate 10. In some embodiments, a material of the common electrode layer 40 includes a transparent conductive material, and this material may include, for example, but is not limited to, indium tin oxide (ITO), indium zinc oxide (IZO), aluminum zinc oxide (AZO), aluminum indium oxide (AlO), indium oxide (InO), gallium oxide (GaN), carbon nanotubes, silver nanoparticles, organic transparent conductive materials, or other suitable transparent conductive materials.

In some embodiments, the active device 100 may be a thin film transistor (TFT). The active device 100 may include a source 110, a channel layer 120, a gate 130 and a drain 140. A portion of the drain 140 is exposed by the via 203 of the electric insulation layer 200. The second electrode portion 320 of the pixel electrode 300 can contact with the exposed portion of the drain 140 through the via 203. As a result, the active device 100 can control the electric field generated by the first electrode portion 310 of the pixel electrode 300, so as to control images displayed by the display medium layer 20.

In some embodiments, each microcapsule 21 includes a plurality of deep-colored charged particles 22 and light-colored charged particles 23. The deep-colored charged particles 22 have charges different from that of the light-colored charged particles 23. The electric field generated by the common electrode layer 40 and the pixel electrode 300 can affect positions of the deep-colored charged particles 22 and light-colored charged particles 23.

Figure 3:
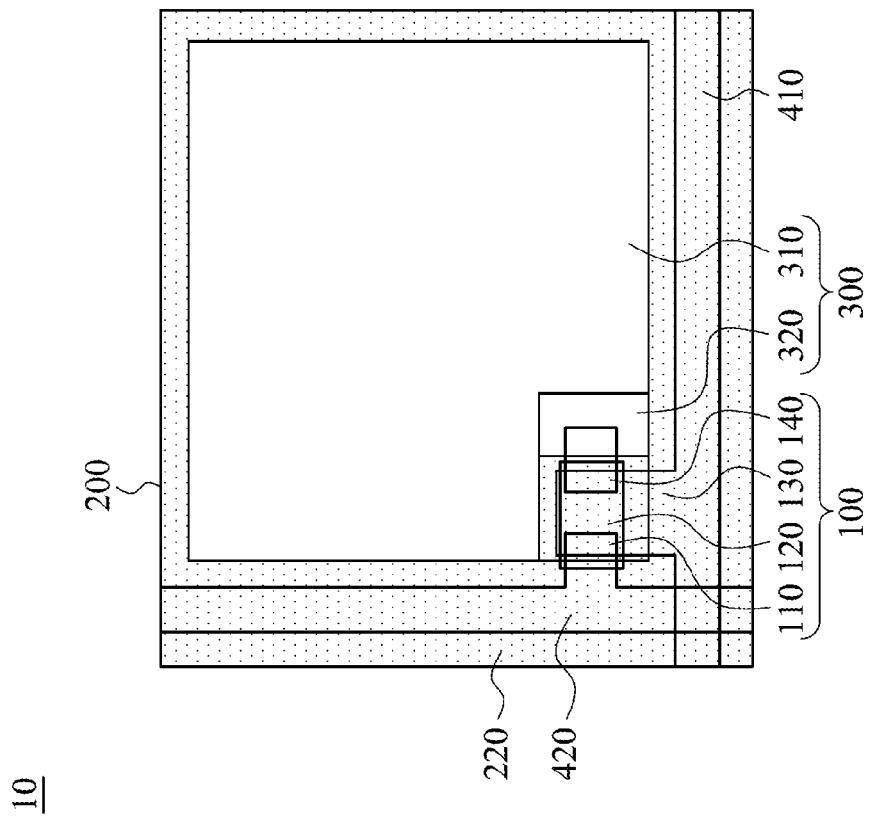
FIG. 3 is a top view of the driving substrate as shown in FIG. 1.

FIG. 3 is a top view of the driving substrate 10 as shown in FIG. 1. As shown in FIG. 3, in some embodiments, the pixel electrode 300 is surrounded by the top insulation portion 220 of the electric insulation layer 200 (shown as screen dot zone in FIG. 3). Therefore, the top insulation portion 220 at a higher height can reduce external mechanical impacts on the pixel electrode 300.

In some embodiments, as shown in FIG. 3, the driving substrate 10 further includes scan lines 410 and data lines 420. The scan line 410 and data line 420 are located below the top insulation portion 220 of the electric insulation layer 200. In other words, the scan line 410 and data line 420 define vertical projections on a top surface of the substrate 400 (See FIG. 2), and these vertical projections are non-overlapped with a vertical projection of the trench 201 (See FIG. 2) on the top surface of the substrate 400.

Figure 4:
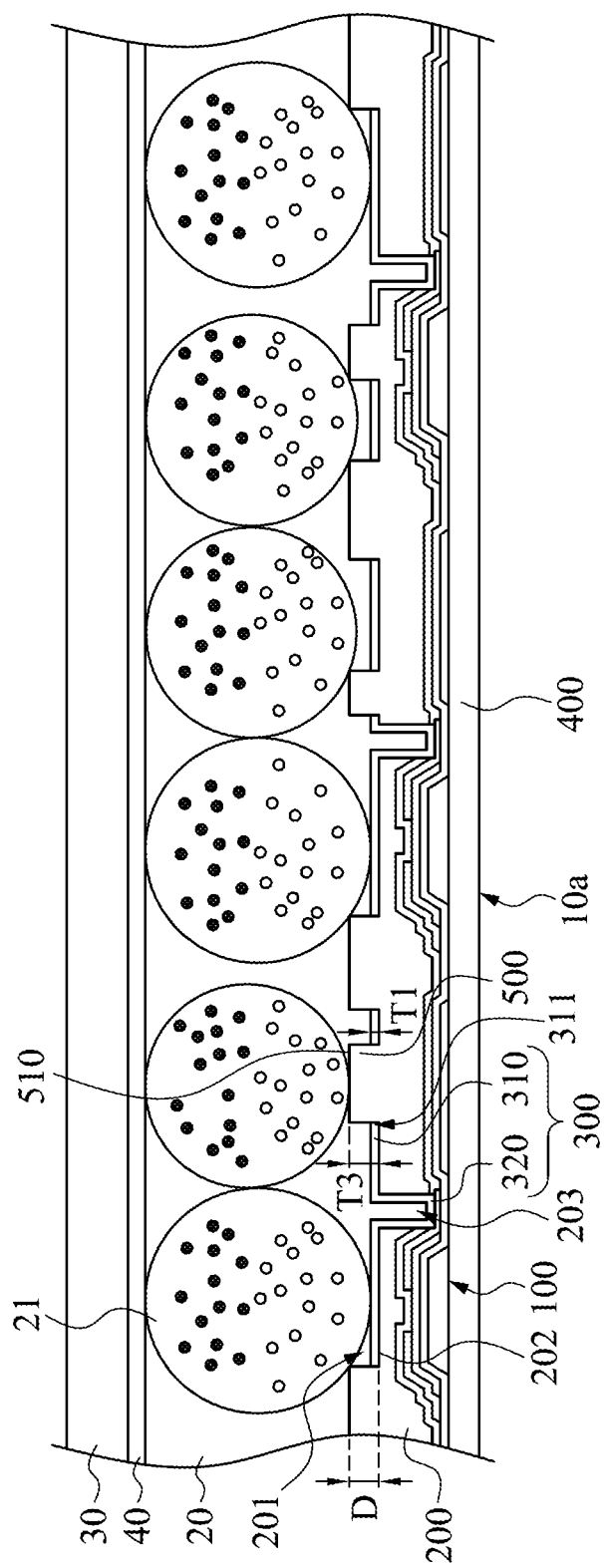
FIG. 4 is a cross-sectional view of a display apparatus in accordance with another embodiment of the present disclosure.

FIG. 4 is a cross-sectional view of a display apparatus in accordance with another embodiment of the present disclosure. As shown in FIG. 4, in some embodiments, the driving substrate 10a further includes a protrusion 500. The protrusion 500 protrudes from the bottom surface 202 of the trench 201. The first electrode portion 310 has an opening 311. The protrusion 500 passes through the opening 311 of the first electrode portion 310, so that the protrusion 500 protrudes or is raised with respect to the first electrode portion 310, and hence damage to the first electrode portion 310 caused by external impact forces can be reduced. Preferably, the protrusion 500 has a thickness T3, wherein the thickness T1 of the first electrode portion 310 is less than the thickness T3 of the protrusion 500. Therefore, a top surface 510 of the protrusion 500 can reduce external mechanical impacts on the first electrode portion 310 when the display apparatus encounters such impacts, so that damage to the first electrode portion 310 can be obviated. Accordingly, this embodiment employs the electric insulation layer 200 as well as the protrusion 500 to buffer impacts on the first electrode portion 310, and damage to the pixel electrode 300 due to these impacts can thus be further prevented.

In some embodiments, the protrusion 500 and the electric insulation layer 200 are monolithically connected to improve their structural strength. For example, the material of the protrusion 500 and the electric insulation layer 200 may include positive photoresist, which includes, but is not limited to, resin and sensitizer. Therefore, the trench 201 and the protrusion 500 protruding in the trench 201 can be formed using exposure and develop.

In some embodiments, the protrusion 500 and the electric insulation layer 200 cooperatively share external impact forces exerted on the display apparatus. The protrusion 500 is located in the top through hole 221 of the top insulation portion 220 and protrudes from the top surface 212 of the bottom insulation portion 210. The thickness T3 of the protrusion 500 may be substantially equal to the depth D of the trench 201, thus reducing impacts on the first electrode portions 310 located on the bottom insulation portion 210.

Figure 5:
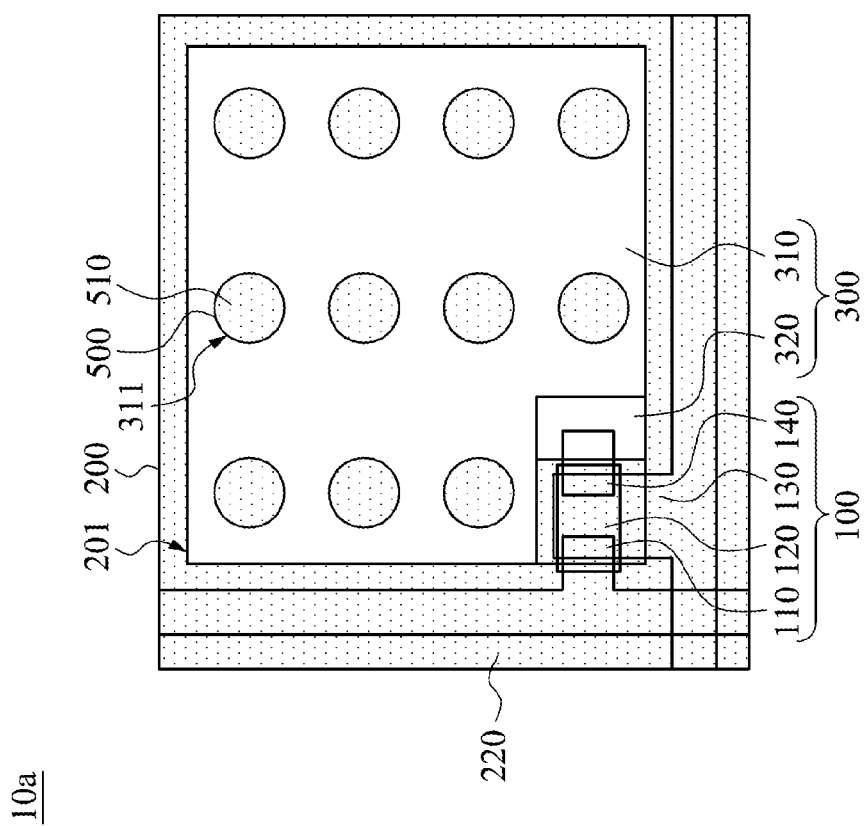
FIG. 5 is a top view of the driving substrate as shown in FIG. 4.

FIG. 5 is a top view of the driving substrate 10a as shown in FIG. 4. As shown in FIG. 5, the first electrode portion 310 has a plurality of openings 311, and the driving substrate 10a includes a plurality of protrusions 500. These protrusions 500 are located in the trench 201 of the electric insulation layer 200 and respectively pass through these opening 311 of the first electrode portion 310. Therefore, the protrusions 500 can protrude with respect to the first electrode portion 310. In some embodiments, contour of the top surface 510 of the protrusion 500 may be, but is not limited to, a circle, an ellipse, a rectangle, a triangle, or other polygons.

Figure 6:
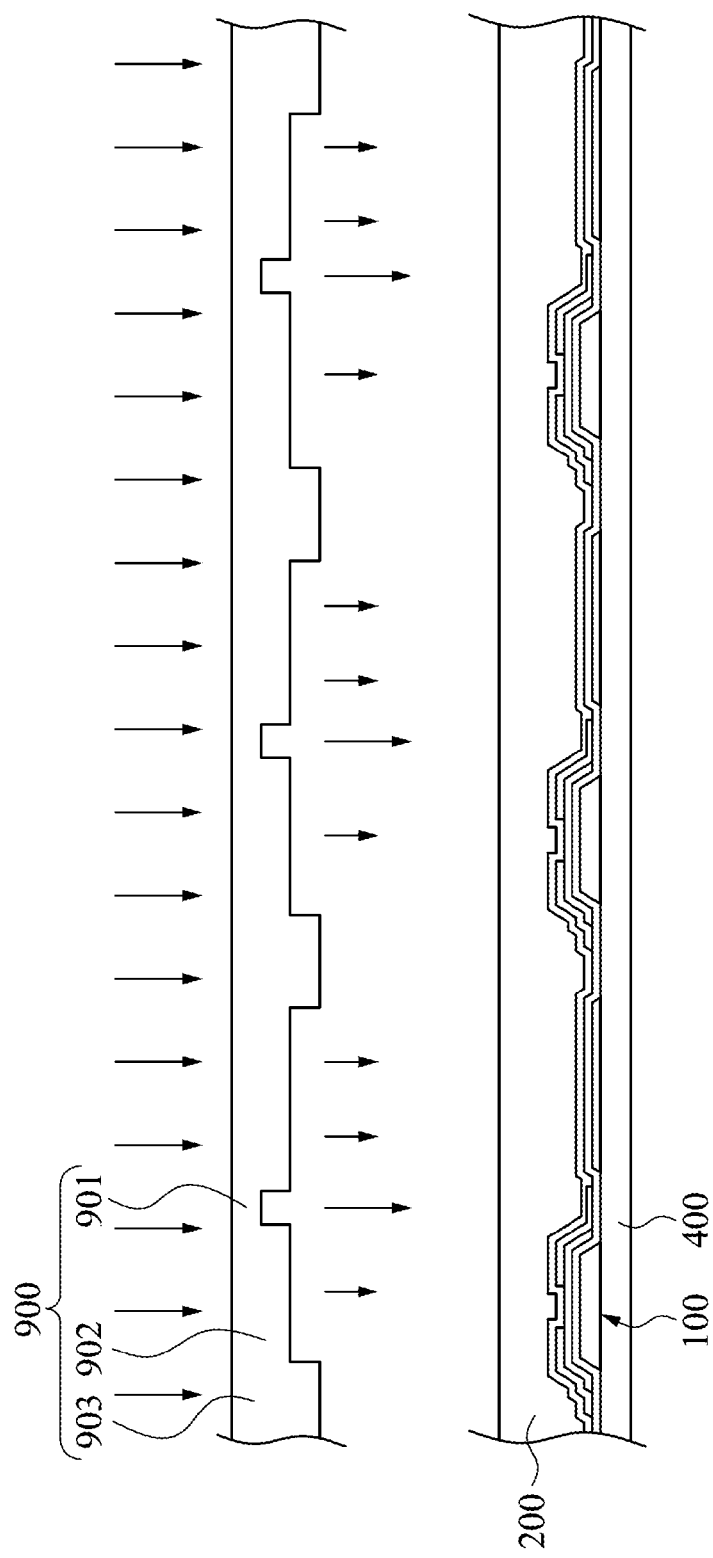
FIGS. 6-8 illustrate a method of forming a driving substrate in accordance with one embodiment of the present disclosure.
Figure 7:
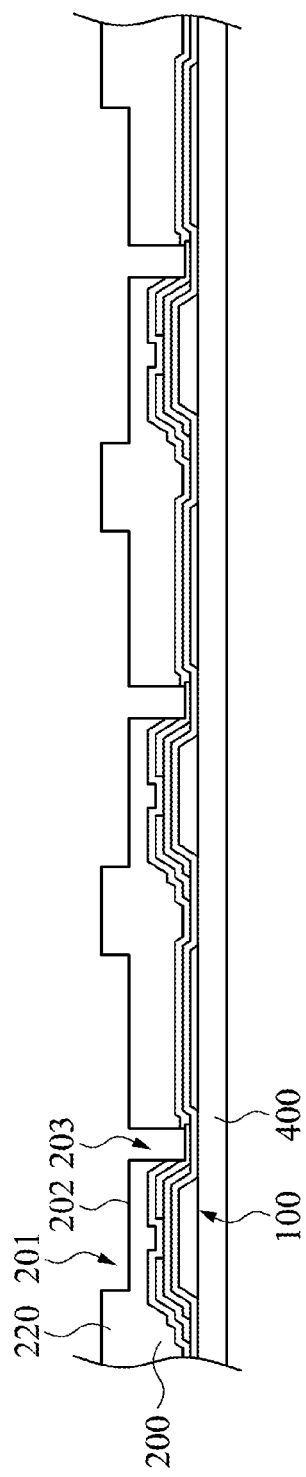
Figure 8:
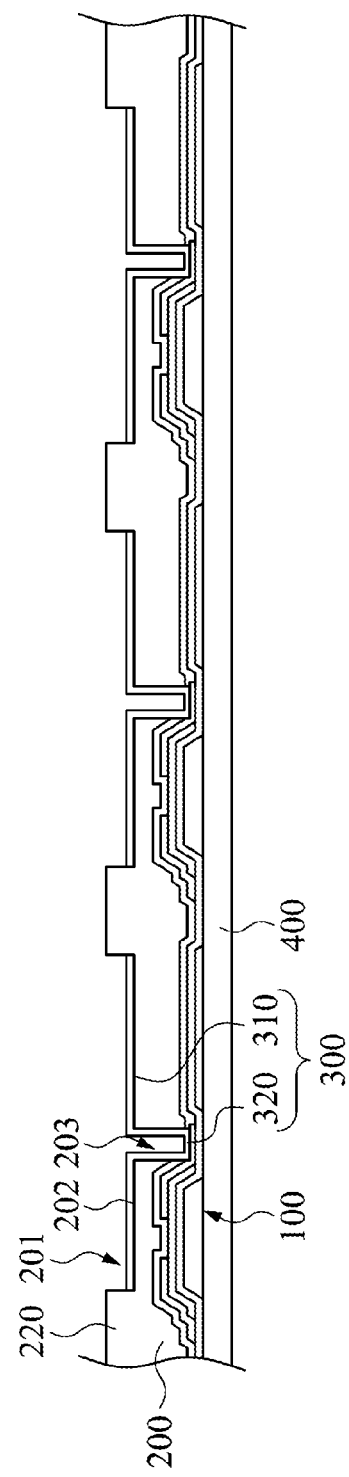

FIGS. 6-8 illustrate a method of forming a driving substrate in accordance with one embodiment of the present disclosure. As shown in FIG. 6, an active device 100 is formed on the substrate 400, and an electric insulation layer 200 is then formed on the active device 100. The electric insulation layer 200 can be formed by positive photoresist, so that suitable trenches and vias can be formed using subsequent exposure and develop. In some embodiments, the positive photoresist can be formed on the active device 100 using spin coating, and the coated positive photoresist can then undergo thermal treatment to implement soft bake process, and the electric insulation layer 200 can thus be formed.

Next, a halftone photomask 900 is provided above the electric insulation layer 200. The halftone photomask 900 includes a first zone 901, a second zone 902 and a third zone 903 having different transmittances. Thereafter, the electric insulation layer 200 masked by the halftone photomask 900 is irradiated (exposed). The transmittance difference among the first, second, and third zones 901-903 may result in different light fluxes passing through the first, second and third zones 901-903, wherein the different light fluxes are illustrated as arrows with different lengths in FIG. 6.

Afterwards, as shown in FIG. 7, the irradiated electric insulation layer 200 is developed to form the trench 201, the via 203 on the bottom surface 202 of the trench 201, and the top insulation portion 220 protruding with respect to the trench 201. The position of the via 203 corresponds to the first zone 901 of the halftone photomask 900, the position of the trench 201 corresponds to the second zone 902 of the halftone photomask 900, and the position of the top insulation portion 220 corresponds to the third zone 903 of the halftone photomask 900. As shown in FIGS. 6 and 7, the trench 201 and the via 203 are formed by performing exposure and develop to the electric insulation layer 200, and positions of the via 203 and the trench 201 respectively correspond to different zones of a photomask having different transmittances, and the photomask is used during the exposure.

Next, as shown in FIG. 8, a pixel electrode 300 is formed on the electric insulation layer 200. In particular, a first electrode portion 310 is conformally formed in the trench 201, and a second electrode portion 320 is conformally formed in the via 203. Formation of the pixel electrode 300 may include, but is not limited to, physical vapor deposition (PVD), chemical vapor deposition (CVD) or plating. During forming the pixel electrode 300, the top insulation portion 220 can be masked by a mask such as a hard mask, and hence the pixel electrode 300 will not be deposited on the top insulation portion 220. In some alternative embodiments, formation of the pixel electrode 300 may include blanket forming conductive material on the electric insulation layer 200, and removing excess conductive material outside the trench 201 and via 203 using a patterning process, leaving the conductive material in the trench 201 and via 203 to form the pixel electrode 300.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A pixel structure, comprising:
an active device;
an electric insulation layer disposed on the active device, the electric insulation layer having a trench and a via, the via being located on a bottom surface of the trench, wherein a portion of the electric insulation layer surrounding the trench is monolithically connected to another portion of the electric insulation layer surrounding the via, and the entire via is below the entire trench, and a total depth of the entire trench is less than a total depth of the entire via that is below the entire trench; and
a pixel electrode having a first electrode portion and a second electrode portion connected to each other, the first electrode portion being located in the trench, wherein a thickness of the first electrode portion is less than the total depth of the entire trench, and the second electrode portion is located in the via and is electrically connected to the active device through the via.

2. The pixel structure of claim 1, wherein a material of the electric insulation layer is a positive photoresist.

3. The pixel structure of claim 1, further comprising:
at least one protrusion protruding from the bottom surface of the trench, wherein the first electrode portion has an opening, and the protrusion passes through the opening.

4. The pixel structure of claim 3, wherein the protrusion is monolithically connected to the electric insulation layer.

5. The pixel structure of claim 3, wherein a thickness of the protrusion is substantially equal to the total depth of the entire trench.

6. The pixel structure of claim 3, wherein a material of the protrusion is a positive photoresist.

7. The pixel structure of claim 1, wherein the trench and the via of the electric insulation layer are formed by performing exposure and develop to the electric insulation layer, wherein positions of the via and the trench respectively correspond to zones of a photomask having different transmittances, and the photomask is used during the exposure.

8. The pixel structure of claim 1, wherein the electric insulation layer comprises:
a bottom insulation portion disposed on the active device, and the bottom insulation portion has a top surface and a bottom through hole formed on the top surface; and
a top insulation portion disposed on the bottom insulation portion and comprising the same material as the bottom insulation portion, wherein the top insulation portion has a top through hole therein, the top through hole is communicated with the bottom through hole, and the top through hole is wider than the bottom through hole, wherein the first electrode portion is located in the top through hole and on the top surface of the bottom insulation portion, a thickness of the first electrode portion is less than that of the top insulation portion, and the second electrode portion is located in the bottom through hole and electrically connected to the active device through the bottom through hole.

9. The pixel structure of claim 8, further comprising:
at least one protrusion located in the top through hole and protruding from the top surface of the bottom insulation portion, wherein the first electrode portion has an opening, and the protrusion passes through the opening.

10. The pixel structure of claim 9, wherein a thickness of the protrusion is substantially equal to that of the top insulation portion.

11. A display apparatus, comprising:
a driving substrate, comprising:
at least one active device;
an electric insulation layer disposed on the active device and having at least one trench and at least one via formed on a bottom surface of the trench, wherein the entire via is below the entire trench, and a total depth of the entire trench is less than a total depth of the entire via that is below the entire trench; and
at least one pixel electrode having a first electrode portion and a second electrode portion connected to each other, wherein the first electrode portion is located in the trench, a thickness of the first electrode portion is less than the total depth of the entire trench, and the second electrode portion is located in the via and electrically connected to the active device through the via;

a display medium layer disposed on the driving substrate; and a cover lens disposed on the display medium layer, wherein the trench is surrounded by a portion of the electric insulation layer.

12. The display apparatus of claim 11, further comprising:

at least one protrusion protruding from the bottom surface of the trench, wherein the first electrode portion has an opening, and the protrusion passes through the opening.

* * * * *